United States Patent
Younsi et al.

(10) Patent No.: US 8,466,689 B2
(45) Date of Patent: Jun. 18, 2013

(54) METHODS AND SYSTEMS FOR MONITORING CAPACITOR BANKS

(75) Inventors: Karim Younsi, Ballston Lake, NY (US); Yingneng Zhou, Niskayuna, NY (US); Samar Shaker Soliman, Marietta, GA (US)

(73) Assignee: General Electric Company, Niskayuna, NY (US)

( * ) Notice: Subject to any disclaimer, the term of this patent is extended or adjusted under 35 U.S.C. 154(b) by 457 days.

(21) Appl. No.: 12/751,858

(22) Filed: Mar. 31, 2010

(65) Prior Publication Data

US 2011/0241695 A1    Oct. 6, 2011

(51) Int. Cl.
    *G01R 31/12*    (2006.01)

(52) U.S. Cl.
    USPC ............... 324/548; 324/76.39; 324/76.41; 324/536; 324/382; 702/65; 702/66; 702/72; 702/76; 361/1; 361/78

(58) Field of Classification Search
    USPC ........... 324/548, 382, 661, 111, 76.39, 76.41, 324/533, 536; 702/65, 66, 72, 76, 77; 361/1, 361/78
    See application file for complete search history.

(56) References Cited

U.S. PATENT DOCUMENTS

| | | | | |
|---|---|---|---|---|
| 7,685,321 | B2 * | 3/2010 | Arndt et al. | 710/5 |
| 7,865,321 | B2 * | 1/2011 | Muthu-Manivannan et al. | 702/65 |
| 2005/0218907 | A1 * | 10/2005 | Lee et al. | 324/551 |
| 2006/0169030 | A1 * | 8/2006 | Stewart et al. | 73/53.01 |
| 2008/0200748 | A1 * | 8/2008 | Testani et al. | 600/13 |
| 2008/0291593 | A1 * | 11/2008 | Day et al. | 361/78 |
| 2009/0167541 | A1 * | 7/2009 | Dooley et al. | 340/635 |
| 2010/0169029 | A1 * | 7/2010 | Benner et al. | 702/58 |
| 2011/0057661 | A1 * | 3/2011 | Samineni et al. | 324/521 |

* cited by examiner

*Primary Examiner* — Huy Q Phan
*Assistant Examiner* — Thang Le
(74) *Attorney, Agent, or Firm* — Seema S. Katragadda

(57) ABSTRACT

A method of monitoring a capacitor bank comprising a plurality of capacitor strings connected in parallel, each capacitor string comprising a plurality of capacitors connected in series is provided. The method includes energizing the capacitor bank. The method includes determining dissipation factors of each of the plurality of the capacitor strings. The method further includes comparing each of the determined dissipation factors with an expected dissipation factor and estimating a health state of the plurality of the capacitor strings based, at least in part, on the comparison of the determined and expected dissipation factors.

19 Claims, 6 Drawing Sheets

METHODS AND SYSTEMS FOR MONITORING CAPACITOR BANKS

BACKGROUND

The present invention relates generally to capacitor banks used in electrical power systems, and more specifically to a method of monitoring the health of a capacitor bank.

In an electric power transmission and distribution system, a load with a low power factor draws more current than a load with a high power factor for the same amount of useful power transferred. Higher currents increase the energy lost in the distribution system and require larger wires the use of heavy duty equipment, which in turn adds to the cost. Therefore, to correct the power factor in electrical power transmission and distribution systems, capacitor banks are often employed.

A capacitor bank is an assembly of a number of capacitor strings connected in parallel with each other with each of the capacitor strings including a number of capacitors connected in series. Capacitor banks add reactive power to the AC mains supply. In three phase power distribution systems, the power factor of each phase may be separately corrected using capacitor banks dedicated to each phase. In one example, the capacitor bank for each phase may contain 1000 capacitors arranged in 50 parallel capacitor strings, each string containing 20 capacitors connected in series. A capacitor failure in such an arrangement may result in voltage imbalance, voltage control problems, harmonic frequency problems, and inefficient system operation, which may cause power outages.

Manual methods for identifying the faulty capacitors in a capacitor bank typically involve disconnecting the capacitors and subsequently testing them individually to determine or locate the faulty capacitors. This method is expensive, time consuming and requires the shutdown of capacitor bank, thus resulting in loss of power and revenue.

Thus there exists a need for methods and systems for monitoring the health of a capacitor bank.

BRIEF DESCRIPTION

A method of monitoring a capacitor bank comprising a plurality of capacitor strings connected in parallel, each capacitor string comprising a plurality of capacitors connected in series, is provided. The method includes energizing the capacitor bank. The method includes determining dissipation factors of each of the plurality of the capacitor strings. The method further includes comparing each of the determined dissipation factors with an expected dissipation factor and estimating a health state of the plurality of the capacitor strings based, at least in part, on the comparison of the determined and expected dissipation factors.

A system for monitoring a capacitor bank comprising a plurality of capacitor strings connected in parallel, each capacitor string comprising a plurality of capacitors connected in series, is provided. The system includes a plurality of current transformers, each coupled to one of the plurality of capacitor strings, for monitoring current waveforms of each of the plurality of capacitor strings. The system further includes a signal processor coupled to the plurality of current transformers for determining dissipation factors of the plurality of capacitor strings, based on the current waveforms; comparing each of the determined dissipation factors with an expected dissipation factor; and estimating a health state of the plurality of the capacitor strings based, at least in part, on the comparison of the determined and expected dissipation factors.

A method of monitoring a capacitor bank comprising a plurality of capacitor strings connected in parallel, each capacitor string comprising a plurality of capacitors connected in series, is provided. The method includes energizing the capacitor bank. The method further includes monitoring high frequency signals of each of the plurality of the capacitor strings. The method then determines spectral signatures of the high frequency signals and comparing each of the determined spectral signatures with one or more known spectral signatures. The method finally estimates a health state of each of the capacitors in each of the plurality of capacitor strings based, at least in part, on the comparison of the determined and the one or more known spectral signatures.

DETAILED DESCRIPTION

Various embodiments of the present invention will be described in detail below with reference to accompanying drawings. It will be apparent, however, that these embodiments may be practiced without some or all of these specific details. In other instances, well known process steps or elements have not been described in detail in order not to unnecessarily obscure the description of the invention. The following example embodiments and their aspects are described and illustrated in conjunction with apparatuses, methods, and systems which are meant to be illustrative examples, not limiting in scope.

The invention provides methods and systems for monitoring the health state of a capacitor bank. A capacitor bank is an assembly of one or more capacitor strings connected in parallel with each other where, each of the capacitor strings includes one or more capacitors connected in series. In embodiments of the present invention, monitoring of the capacitor bank may include determining one or more parameters of each of the capacitor strings and/or capacitors and estimating the health state of the capacitor strings and/or based on the determined parameters.

Figure 1:
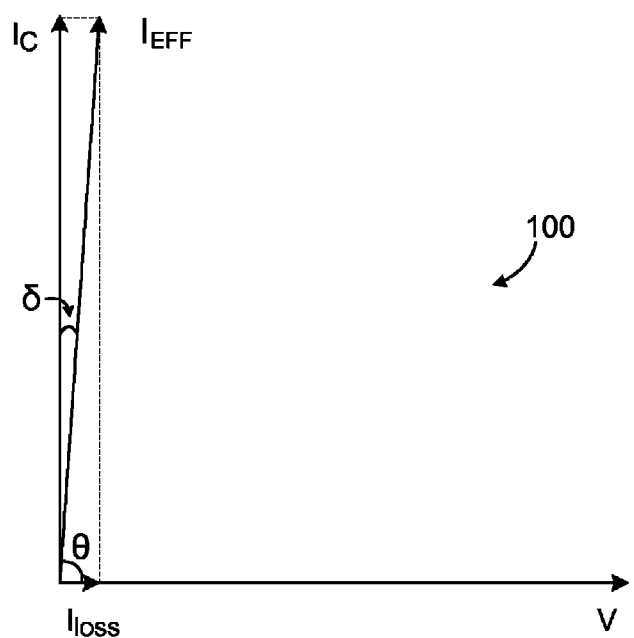
FIG. 1 is an exemplary phasor diagram of a phase relationship between electrical waveforms of a healthy capacitor string, in accordance with one embodiment.

FIG. 1 is an exemplary phasor diagram 100 illustrating the phase relationship between the electrical waveforms of a healthy capacitor string, in accordance with an embodiment of the present invention. In an ideal capacitor string utilizing true capacitors constructed using perfect dielectrics, the current $I_C$ through the capacitor string leads the voltage V by 90 degrees. However, this is rarely the case. A practical capacitor may have imperfections within the capacitor that introduce resistance. For example, imperfections in the dielectric material, plate material, and terminal leads introduce electrical resistance. When the dielectric material is not perfect and exhibits a small amount of conductance, current flows directly through this conductance between the two electrodes. Thus, a practical capacitor may be represented as an ideal capacitor in parallel with an electrical conductance G. The electrical resistance is denoted as an Equivalent Series Resistance (ESR). The current (or loss current) flowing through the conductance is illustrated in phasor diagram 100 as $I_{loss}$, which is in phase with the voltage V. Considering the ESR, the effective current $I_{EFF}$ flowing through the capacitor string is the effective value of $I_C$ and $I_{loss}$. Thus, the effective current $I_{EFF}$ leads V by less than 90 degrees. In other words, a phase difference of δ (delta) exists between the current $I_C$ through an ideal capacitor string, and the current $I_{EFF}$ through a practical capacitor string.

A healthy capacitor string, where all the capacitors are healthy, exhibits a small conductance G. The loss current $I_{loss}$ has a small magnitude, and thus the phase difference δ is small. As the capacitor string ages, the conductance G of the capacitor string gradually increases over time, while the capacitance $I_C$ decreases over time. A faulty capacitor string may exhibit a large phase difference δ.

Figure 2:
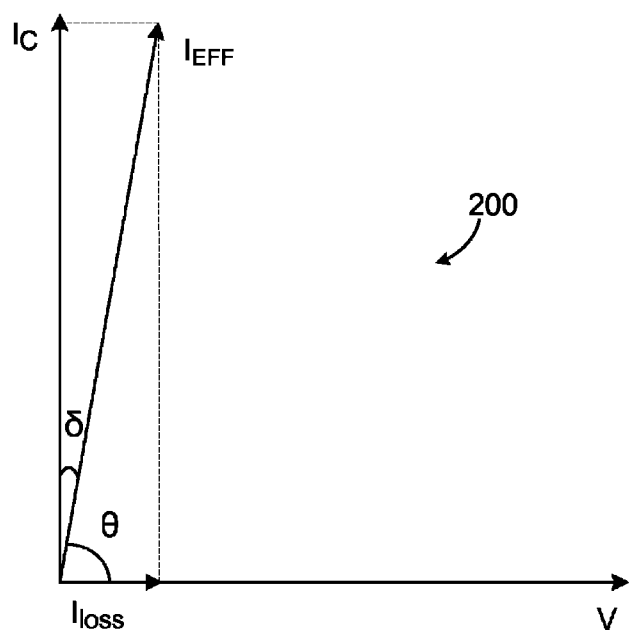
FIG. 2 is an exemplary phasor diagram of a phase relationship between electrical waveforms of a faulty capacitor string, in accordance with one embodiment.

FIG. 2 illustrates an exemplary phasor diagram 200 showing phase relationship between the electrical waveforms of a faulty capacitor string, in accordance with an embodiment of the present invention. The phase difference δ of the faulty capacitor string as shown in FIG. 2 is greater than that of the healthy capacitor string as shown in FIG. 1.

The phase difference δ may be used for calculating the dissipation factor (DF) of the capacitor string using the formula:

$$DF = \tan\delta = \frac{X_P}{R_P} = \frac{G}{\omega R_P C_P} = \frac{I_{loss}}{I_C} \qquad \text{Equation 1}$$

where Xp is the parallel reactance of the capacitor string, Rp is the equivalent AC parallel resistance, and G is the equivalent AC conductance. The dissipation factor is the loss-rate of power in a dissipative system.

In embodiments of the present invention, a capacitor bank monitoring system uses the DF of the capacitor string to estimate the health of the capacitor string. A healthy capacitor string may have a very small conductance G in comparison to Cp, resulting in a small phase difference δ. In other words, according to equation 1, a healthy capacitor string exhibits a small DF. As the capacitor string ages, the conductance of the capacitor string gradually increases over time, while the capacitance Cp decreases over time. A faulty capacitor string may exhibit an increased conductance G, a decreased Cp, or both, resulting in a large phase difference δ, and consequently a large DF. Moreover, if a capacitor in the capacitor string fails, there will be a step change in the conductance G and the Cp of the capacitor string. A capacitor failure resulting in an open circuit capacitor will exhibit a step increase in the conductance and a step decrease in Cp. A capacitor failure resulting in a short circuit capacitor will exhibit a step decrease in Cp. In both scenarios, the failure of a capacitor in the capacitor string may be detected as a step increase in the DF, i.e. a step increase in the phase angle δ.

The DF of the capacitor string may also change due to temperature. Capacitor banks are usually outdoor structures, due to their large size and to facilitate natural air cooling. Incident sunlight may cause changes in temperature in the capacitor strings. For example, the sunlight incident on the capacitor bank may cause changes in the temperatures of the capacitor strings. At different times of the day, the angle of incidence of the sunlight may be different, thus causing different levels of heating in the different capacitor strings. At any given time of the day, some capacitor strings may receive direct sunlight, while others may be shaded. This may result in temperature variation across the capacitor strings. Such changes in temperature may affect the total capacitance of the capacitor string. However, changes in the capacitance due to the ambient conditions are gradual. Therefore, changes in the DF of each of the capacitor strings may also be gradual. In various embodiments of the present invention, the capacitor bank monitoring system may take into account the gradual variations in the DF caused due to changes in temperature while estimating the health state of the capacitor string.

In various embodiments of the present invention, a capacitor bank monitoring system may periodically measure the DF of each of the capacitor strings, and monitor the changes in the DF or the trend of DFs to report the health state of the capacitor strings. Such periodic monitoring of the DF may minimize false alarms caused due to changes in temperature causing changes in DF, while still maintaining accuracy of detecting that failed capacitors may have caused the changes in DF.

In various embodiments of the present invention, the capacitor bank monitoring system may estimate the health state of a capacitor string by monitoring the phase angle between $I_{EFF}$ and V, denoted by θ (theta). The DF may be calculated from the phase angle θ using the formula:

$$DF = \tan\delta = \tan\left(\frac{\pi}{2} - \theta\right) = \frac{1}{\tan\theta} \qquad \text{Equation 2}$$

For a healthy capacitor string, the phase angle θ may be close to 90 degrees. The phase angle θ decreases as the capacitor string degrades in quality.

With time, the dielectric material of capacitors deteriorates. The dielectric material breaks down in localized regions due to the high operating voltage of the capacitor bank, causing partial discharge activity. The partial discharge may emit energy in the form of acoustic emissions—both audible as well as ultrasonic, gaseous emissions, and electromagnetic emissions in the form of radio waves, visible light and heat. Such partial discharge activity is indicative of ageing capacitors, or capacitors with poor health states, usually impending failure. The partial discharge activity may propagate and may accelerate deterioration of the dielectric material until the dielectric material is unable to withstand the electrical stresses and fails completely.

Figure 3:
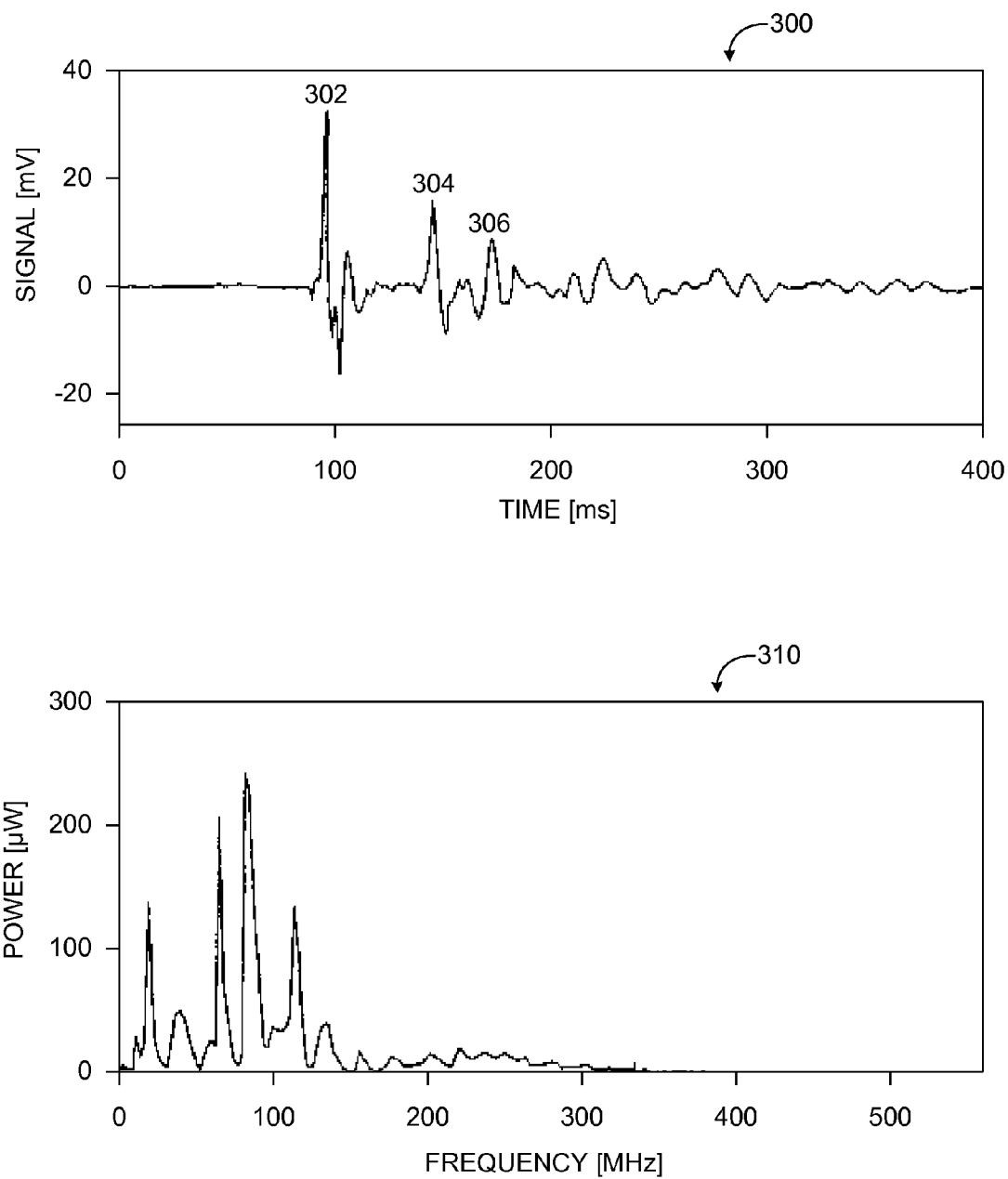
FIG. 3 is an exemplary spectral signature of high frequency signals of a capacitor string, in accordance with one embodiment.

FIG. 3 shows exemplary electromagnetic emissions caused due to partial discharge activity in the capacitors of a given capacitor string, in accordance with an embodiment of the present invention. Graph 300 illustrates the time domain representation of the electromagnetic emissions of partial discharge activity. Radio frequency (RF) pulses associated with partial discharge activity in a particular capacitor will travel in both directions within the capacitor string—i.e. towards the high tension power supply line, and towards the ground connection of the capacitor string. The RF pulses may suffer attenuation as they propagate along the capacitor string, and at the capacitor string terminations i.e. at the ends of the capacitor strings. The RF pulses may also suffer multiple reflections at both the capacitor string terminations. For example, RF pulse 302 may be the RF pulse from a faulty capacitor arriving directly at a given end of the capacitor string. RF pulses 304 and 306 may be the first and second reflections of the RF pulse from the capacitor string terminations. In various embodiments of the present invention, the capacitor bank monitoring system may monitor the RF pulses at a given point within each capacitor string. The capacitor bank monitoring system may then record the timing and amplitude of the RF pulses. Based on the timing and amplitude of the RF pulses, the capacitor bank monitoring system may determine the location of the PD activity, i.e. which capacitor in the capacitor string is emitting partial discharges.

Graph 310 illustrates the frequency domain representation of the electromagnetic emissions of partial discharge activity. In various embodiments, the capacitor bank monitoring system may transform the time domain RF signal of the capacitor string to the frequency domain for spectral analysis. The capacitor string may have different spectral signatures for different locations of PD activity, i.e. different locations of failed or faulty capacitors. The capacitor bank monitoring system may include a library of known spectral signatures associated with various health states of the capacitor string. For example, the library may include known spectral signatures of capacitor strings having faulty capacitors in particular locations within the capacitor string, known spectral signatures of a healthy capacitor string, and so forth. The capacitor bank monitoring system may thus use the spectral signature of the high frequency signals of the capacitor string to identify the individual faulty capacitor in the capacitor string. An exemplary process of identifying the faulty capacitors within a capacitor string is described in conjunction with FIG. 4.

Figure 4:
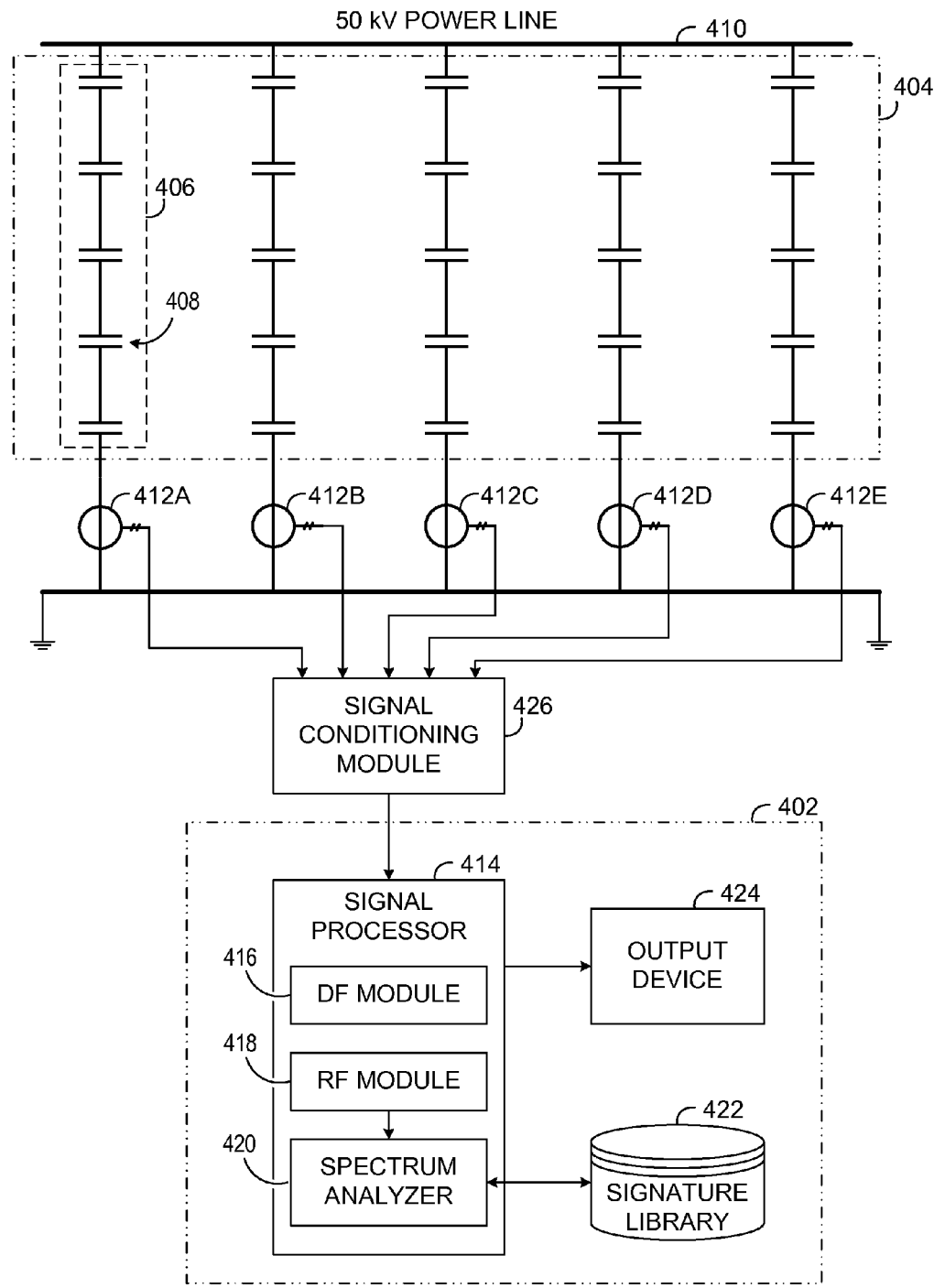
FIG. 4 is a block diagram illustrating an exemplary system for monitoring the health state of an online capacitor bank, in accordance with one embodiment.

FIG. 4 illustrates an environment 400 in which embodiments of the present invention may operate. Environment 400 includes a system 402 for monitoring the health state of an online capacitor bank 404, in accordance with an example embodiment of the present invention. As shown in the FIG. 4, the capacitor bank 404 includes capacitor strings 406 connected in parallel with each other where, each capacitor string includes capacitors 408 connected in series. The capacitors 408 in the capacitor bank 404 may be arranged and installed in any manner that allows rapid replacement of failed or degraded capacitors without departing from the scope of the invention. In an embodiment of the present invention, the capacitor bank 404 may be connected to an electrical power transmission and distribution system through a high tension power line 410. Each capacitor string 406 is connected to the primary windings of a current transformer 412. Each of the current transformers may output a signal representing the current waveform of the corresponding capacitor string. The secondary windings of the current transformer 412 are connected to a capacitor bank monitoring system 402.

The capacitor bank monitoring system 402 includes a signal processor 414. The signal processor 414 includes a dissipation factor (DF) module 416, an RF module 418, and a spectrum analyzer 420. The capacitor bank monitoring system 402 may further include a signature library 422, and an output device 424. In some embodiments of the present invention, a signal conditioning module 426 may be used for pre-processing the signals transmitted by the current transformers. The signal conditioning module 426 may perform various operations on the received current waveforms such as, but not limited to, filtering, amplification, attenuation, isolation, analog to digital conversion, and the like. For example, the signals may be passed through a filter for removing any noise component that may be present in the waveform. The signal conditioning module may output the conditioned signals to the signal processor 414.

The signal processor 414 receives the current waveforms from each of the current transformers 412. In some embodiments, the signal processor 414 receives the conditioned current waveforms from signal conditioning module 426. The DF module 416 determines the dissipation factor based on the current waveforms. In some embodiments, the DF module 416 may calculate the dissipation factor of each of the capacitor strings 406 by measuring the phase difference $\phi$ between $I_{EFF}$ and $V_O$, and using Equation 1. In some other embodiments, the DF module 416 may calculate the dissipation factor of each of the capacitor strings 406 by measuring the phase difference $\delta$ between $I_{EFF}$ and $I_C$, and using Equation 2.

The signal processor 414 may then compare the calculated dissipation factors with an expected dissipation factor. The expected dissipation factor may be the dissipation factor of a healthy capacitor string. The expected dissipation factor may be a fixed value preset for monitoring purposes or a self-generated value measured under a selected operating condition. In various embodiments, since the capacitor strings 406 are identical in construction, the expected dissipation factor may be same for all the capacitor strings 406. In an embodiment of the present invention, the expected dissipation factor may be different for each capacitor string. In some embodiments, the expected dissipation factor may be stored in a memory of the signal processor 414. In some other embodiments, the expected dissipation factor may be stored in a memory external to the signal processor 414, such as an external flash memory chip, a magnetic storage medium, an optical storage medium, and the like. The expected dissipation factor may be obtained by the signal processor at any desired operating state, such as during initial construction or installation, normal system operation, scheduled maintenance testing, test procedures using external equipment, self-test procedures (e.g., built-in test procedures), or other operational and test modes of the system.

Based on the results of the comparison, the signal processor 414 may estimate a health state of each of the capacitor strings 406. The difference between the calculated dissipation factors and the expected dissipation factor may indicate the health state of the capacitor string. In an embodiment of the present invention, the health state may include, without limitation, degradation level of the capacitor string 406, life expectancy of the capacitor string 406, faulty string indication, and so forth. The health state may be used to monitor the overall status of the capacitor bank.

In various embodiments, the calculation of the dissipation factors and the comparison with the expected dissipation factor may be performed at preset intervals of time. The signal processor 414 may take into account a number of previous calculations of the dissipation factors for each of the capacitor strings, to determine whether the calculated dissipation factors remain substantially constant, exhibit gradual changes with time, or exhibit a step change with time. As described in conjunction with FIG. 1 and FIG. 2, gradual changes in the calculated dissipation factors may be attributed to changes in ambient temperature, whereas a step change in the calculated dissipation factor may be attributed to failure of one or more capacitors 408 within the capacitor string 406.

In various embodiments, in addition to estimating the health state of each of the capacitor strings 406, the capacitor bank monitoring system 402 may also estimate the health state of the capacitors 408 within the faulty capacitor string. As described above in conjunction with FIG. 3, a high frequency signal representing the partial discharge activity or corona activity may be emitted by each of the capacitor strings in the capacitor bank. When one or more capacitors of the capacitor string fails, the RF signal of the string changes depending on the location of the failed capacitors within the string. The RF module 418 may receive the RF signals from the current transformers 412. In some embodiments, the RF module 418 may receive conditioned RF signals from the signal conditioning module 426.

The RF module 418 may monitor the RF signals of each of the capacitor strings 406. In some embodiments, the RF module 418 may monitor the RF signals of only those capacitor strings 406 which have been identified as faulty by the DF module 416. In some other embodiments, the RF module 418 may monitor the RF signals of all the capacitor strings 406. The RF module 418 may then record the timing and amplitude of the RF pulses. Based on the timing and amplitude of the RF pulses the signal processor 414 may determine the location of the PD activity, i.e. which capacitor in the capacitor string is emitting partial discharges.

In various embodiments, the RF module 418 may transmit the RF signals to spectrum analyzer 420 for further processing. The spectrum analyzer 420 may transform the RF signals from the time domain to the frequency domain for spectral analysis. The spectrum analyzer 420 may use known transforms such as the Fourier transform to transform the RF signals into the frequency domain. The spectrum analyzer 420 may use a circuit or a program code to implement Discrete Fourier Transform (DFT), Discrete Time Fourier Transform (DTFT), or Fast Fourier Transform (FFT) for the transformation. The DTFT, or DFT, or FFT results in a representation of the RF signals in the frequency domain, i.e. quantifying the various frequency components present in the RF signal. The RF module 418 may provide the samples of continuous time RF signals to the spectrum analyzer 420. Alternatively, the signal conditioning module 426 may directly provide the samples of the continuous time RF signals to the spectrum analyzer 420.

The spectrum analyzer 420 may then determine spectral signatures of the RF signals of each of the capacitor strings. The spectral signature of the RF signals may be the in the form of an amplitude, or power, or intensity or phase versus the frequency components of the RF signal.

The spectrum analyzer 420 may then compare the determined spectral signature of the RF signals with known spectral signatures stored in the signature library 422. The signature library 422 may include various spectral signatures corresponding to healthy capacitor strings, or capacitor strings having faulty capacitors in particular known locations, or capacitor strings having failed capacitors in particular locations, and so forth. For example, a spectral signature may correspond to a capacitor string with the first capacitor in the string having failed, and the third and fourth capacitors in the string exhibiting low levels of partial discharge activity. The signature library 422 may also include information associated with each of the spectral signatures stored therein, indicating which capacitors have failed, which capacitors are faulty, and which capacitors are healthy. Such information may be included as tags, metadata or other suitable forms of association with spectral signatures. The spectrum analyzer 420 may then estimate the health state of the capacitors based on the result of the comparison. In embodiments of the present invention, the health state of the capacitors may include, without limitation, degradation level of the capacitors 408, life expectancy of the capacitors 408, indication of which capacitors may be faulty, indications of which capacitors may have failed, and the like.

The spectral signatures stored in the signature library 422 may be recorded from other capacitor banks which have suffered capacitor failure, from past capacitor failures in the same capacitor bank, from offline capacitor bank testing, and so forth. In some embodiments, the spectral signatures in the signature library 422 may be obtained from computer aided simulations and analysis of capacitor systems.

In some embodiments, the spectrum analyzer 420 may include algorithms to estimate the health state of the capacitors directly from the determined spectral signatures of the capacitor strings. Such algorithms may take into account various factors such as, but not limited to, the phases present in the various frequency components, the intensities of the various frequency components, the amplitudes of the various frequency components, and so forth. For example, the algorithms may include logic such as determining that the second capacitor from the top of the capacitor string is faulty if the determined spectral signature has a 28 MHz frequency component with a 45 degree phase angle and the power exceeds 45 mW. In some other embodiments, the spectrum analyzer 420 may present the determined spectral signature for visual display to a field engineer, who will make the diagnosis of the health state of the capacitors in the capacitor string.

The signal processor 414 may communicate the result of the processing to the output device 424. In an embodiment of the present invention, the output device 424 may display, among other information, the health state of the capacitor strings and the capacitors to the operator for monitoring the health of the capacitor bank. In some embodiments, the output device 424 may be a network adaptor for connecting to a remote monitoring site for monitoring the capacitor bank.

Figure 5:
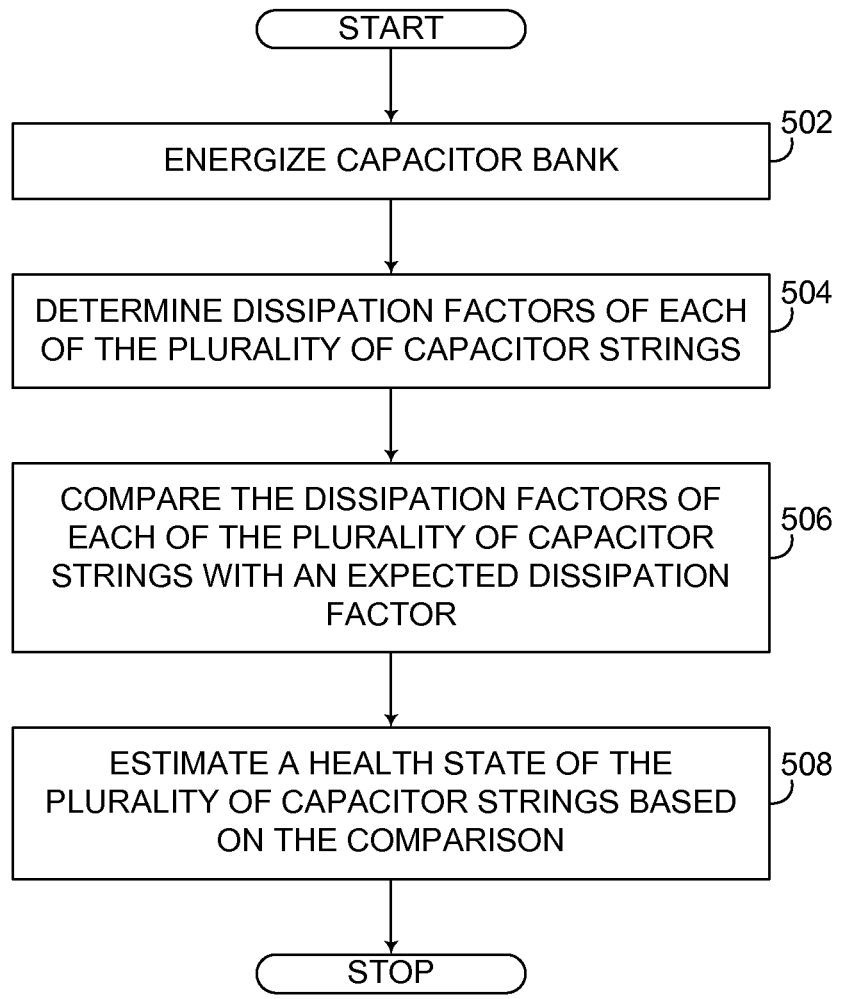
FIG. 5 is a flowchart illustrating an exemplary process for monitoring the health state of an online capacitor bank, in accordance with one embodiment.

FIG. 5 illustrates a flowchart of an exemplary process for monitoring the health state of the online capacitor bank, in accordance with one embodiment of the present invention. The capacitor bank includes a number of capacitor strings connected in parallel with each other where, each capacitor string includes a number of capacitors connected in series. At step 502, the capacitor bank may be energized by a power source such as, but not limited to a high voltage power supply line.

At step 504, the capacitor bank monitoring system 402 determines the dissipation factors for each of the capacitor strings. In an embodiment, the capacitor bank monitoring system 402 monitors the current waveform of each of the capacitor strings. The capacitor bank monitoring system 402 may receive the current waveforms from a current transformer for each of the capacitor strings. The capacitor bank monitoring system 402 may then determine the phase angle between the current waveforms and the voltage waveform. The capacitor bank monitoring system 402 may then calculate the dissipation factor based on the phase angles, using Equation 1 or Equation 2.

At step 506, the capacitor bank monitoring system 402 compares each of the determined dissipation factors with the expected dissipation factor. The expected dissipation factor may be the dissipation factor of a healthy capacitor string. The expected dissipation factor may be a fixed value preset for monitoring purposes or a self-generated value measured under a selected operating condition.

At step 508, the capacitor bank monitoring system 402 estimates the health state of the capacitor strings 406, based on the comparison. For example, if a capacitor in the capacitor string fails, there will be a step change in the ESR and the Xc of the capacitor string—resulting in a step increase in the phase angle δ. Therefore, the failure of a capacitor 408 in the capacitor string 406 may be detected as a step increase in the DF. In various embodiments of the present invention, a capacitor bank monitoring system 402 may periodically measure the DF of each of the capacitor strings 406, and monitor the step changes in the DF, to report the health state of the capacitor strings 406. Such periodic monitoring may allow the capacitor bank monitoring system 402 to take into account gradual changes in DF caused due to changes in ambient temperature, and not report the capacitor string 406 as having a faulty health state.

The DF of the capacitor string may also change due to temperature. However, changes in the capacitance due to the ambient conditions are gradual. Therefore, changes in the DF of each of the capacitor strings may also be gradual. In various embodiments of the present invention, the capacitor bank monitoring system 402 may take into account the gradual variations in the DF caused due to changes in temperature for estimating the health state of the capacitor string.

The capacitor bank monitoring system 402 may report the estimated health state so as to permit timely service (ranging from minor maintenance to replacement) of the faulty capacitors 408 prior to a complete failure of the capacitors 408.

Figure 6:
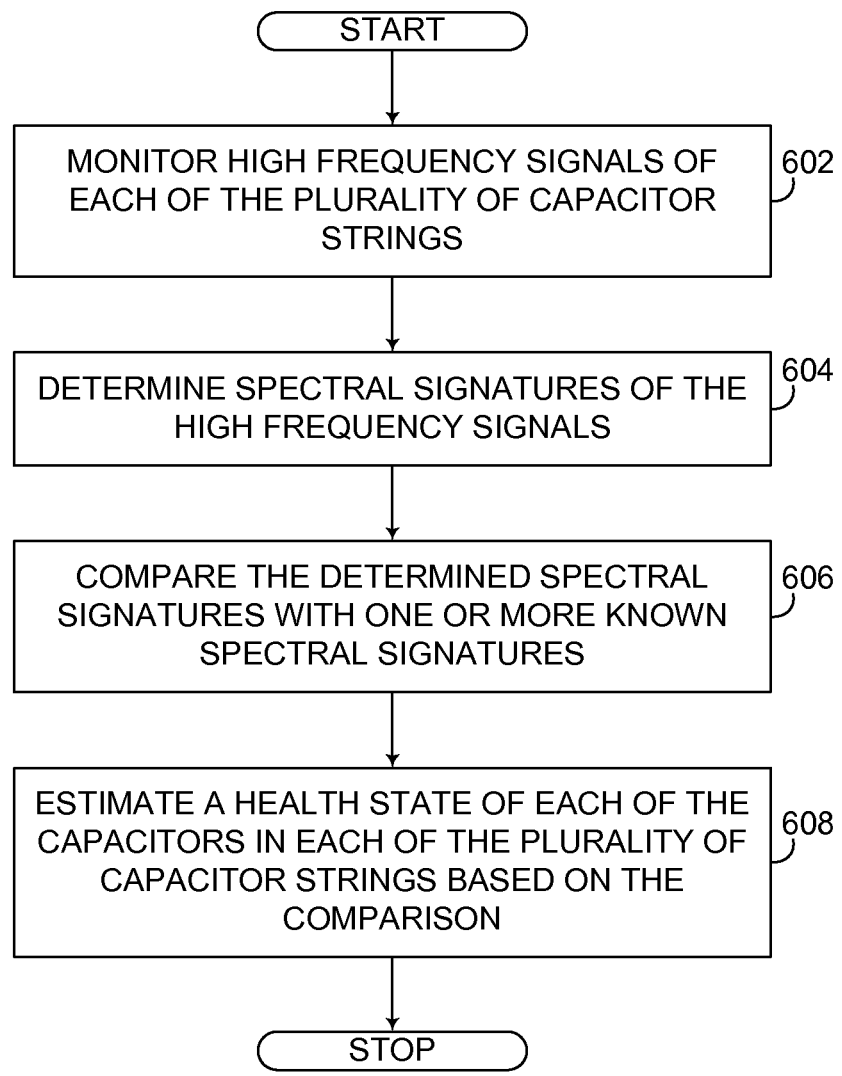
FIG. 6 is a flowchart illustrating an exemplary process for monitoring the health state of individual capacitors in a particular capacitor string of a capacitor bank, in accordance with one embodiment.

FIG. 6 illustrates a flowchart of an exemplary process for monitoring the health state of individual capacitors in a particular capacitor string of a capacitor bank, in accordance with one embodiment of the present invention. As described in conjunction with FIG. 2, each capacitor string may emit a high frequency signal representing the partial discharge or corona activity of the capacitors in the string. When a capacitor in the capacitor string fails, a corresponding change in the high frequency signal may be reflected. Further, the change in the high frequency signal may be dependent on the location of the capacitor in the string. Thus, it may be possible to estimate the health state of each of the capacitors in the capacitor string.

At step 602, the capacitor bank monitoring system 402 monitors the high frequency signals of each of the capacitor strings. In one embodiment, the capacitor bank monitoring system 402 monitors the high frequency signals of all the capacitor strings. In another embodiment, the capacitor bank monitoring system 402 monitors the high frequency signals of the faulty capacitor strings.

At step 604, the capacitor bank monitoring system 402 determines the spectral signatures of the high frequency signals. In one embodiment, the capacitor bank monitoring system 402 may use a FFT algorithm to transform the monitored high frequency signals into a frequency domain representation, and forming the spectral signature of the capacitor strings 406.

At step 606, the capacitor bank monitoring system 402 compares the determined spectral signatures with known spectral signatures present in the signature library 422. The signature 422 library may include a number of known spectral signatures. The signature library 422 may include the spectral signature corresponding to failure of each capacitor in the string. In an embodiment of the present invention, the signature library may include the spectral signatures corresponding to multiple capacitor failures in the capacitor string.

At step 608, the capacitor bank monitoring system 402 estimates the health state of each of the capacitors in the capacitor string based on the comparison. The health state may be monitored to identify the faulty capacitors in the capacitor string. In various embodiments, the health state of the capacitors may be monitored on a continuous or a periodic basis, and during operation of the capacitor bank. The health state may be reported to the operator so as to permit timely service (ranging from minor maintenance to replacement) of the faulty capacitors prior to a complete failure of the capacitors.

Figure 7:
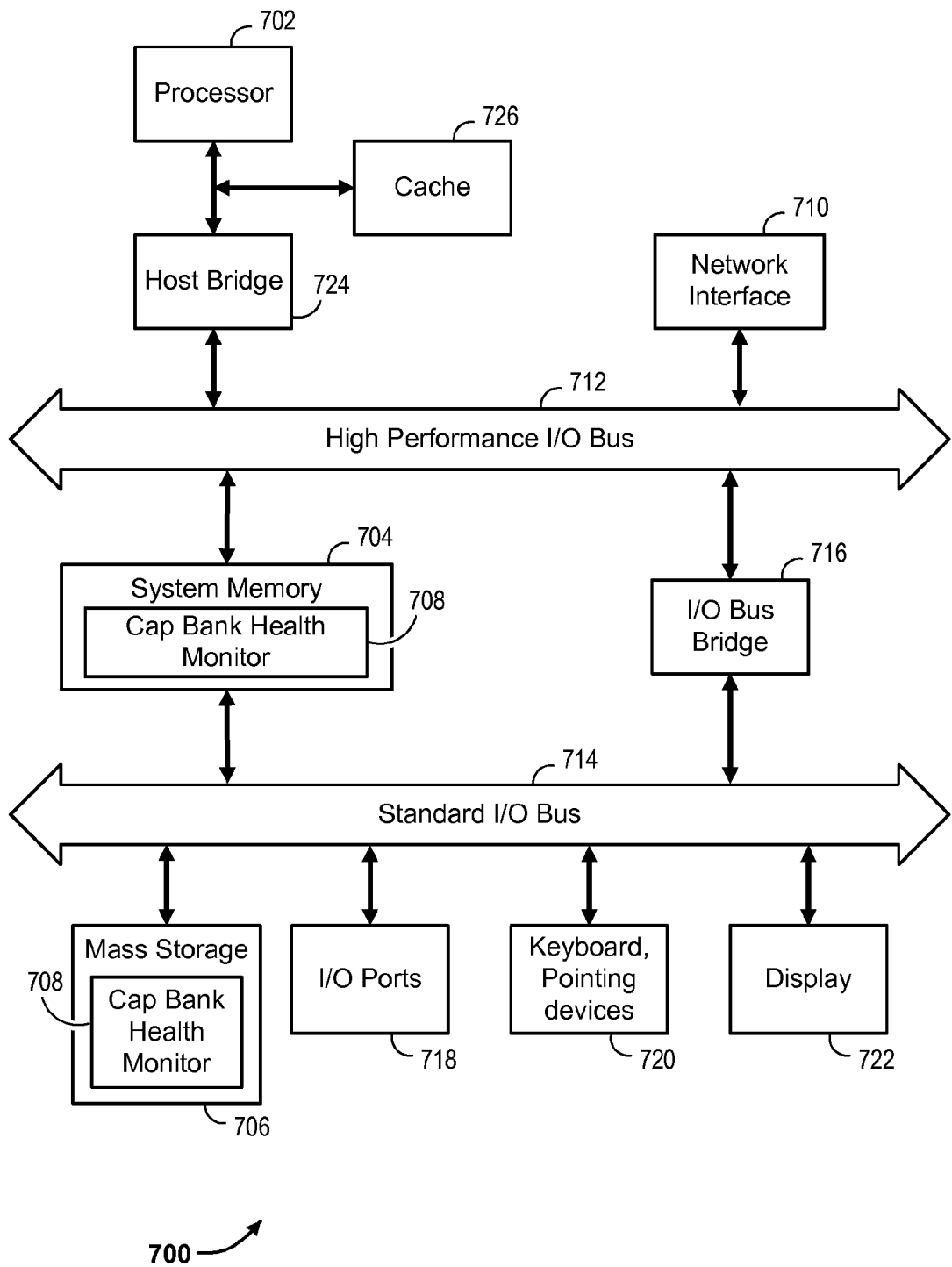
FIG. 7 is an exemplary computer system for implementing the capacitor bank monitoring system, in accordance with one embodiment.

FIG. 7 illustrates an example hardware system 700 to implement capacitor bank monitoring system according to one embodiment. Hardware system 700 includes at least one processor 702, a system memory 704, and mass storage 706. The system memory 704 has stored therein one or more application software, programming instructions 708 for implementing a capacitor bank monitoring processes 500 and 600, an operating system and drivers directed to the functions described herein. Mass storage 706 provides permanent storage for the data and programming instructions 708 for capacitor bank monitoring processes 500 and 600, whereas system memory 704 (e.g., DRAM) provides temporary storage for the data and programming instructions when executed by processor 702. The process flow of the programming instructions 708 for capacitor bank monitoring processes 500 and 600 is described in detail in conjunction with FIG. 5 and FIG. 6, respectively. In one embodiment, signature library 108 may reside in mass storage 706. A network/communication interface 710 provides communication between hardware system 700 and any of a wide range of networks, such as an Ethernet (e.g., IEEE 802.3) network, etc. Additionally, hardware system 700 includes a high performance input/output (I/O) bus 712 and a standard I/O bus 714. System memory 704 and network/communication interface 710 are coupled to bus 712. Mass storage 706 is coupled to bus 714. I/O Bus Bridge 716 couples the two buses 712 and 714 to each other.

In one embodiment, capacitor bank monitoring process 200 described herein is implemented as a series of software routines run by hardware system 700. These software routines comprise a plurality or series of instructions to be executed by a processor in a hardware system, such as processor 702. Initially, the series of instructions are stored on a storage device, such as mass storage 706. However, the series of instructions can be stored on any suitable storage medium, such as a diskette, CD-ROM, ROM, EEPROM, DVD, Blu-ray disk, etc. Furthermore, the series of instructions need not be stored locally, and could be received from a remote storage device, such as server on a network, via network/communication interface 710. The instructions are copied from the storage device, such as mass storage 706, into memory 704 and then accessed and executed by processor 702.

In one embodiment, hardware system 700 may also include I/O ports 718, a keyboard and pointing device 720, a display 722 coupled to bus 712. I/O ports 718 are one or more serial and/or parallel communication ports that provide communication between additional peripheral devices, which may be coupled to hardware system 700. A host bridge 724 couples processor 702 to high performance I/O bus 712. Hardware system 700 may further include video memory (not shown) and a display device coupled to the video memory. Collectively, these elements are intended to represent a broad category of computer hardware systems, including but not limited to general purpose computer systems based on the x86-compatible processors manufactured by Intel Corporation of Santa Clara, Calif., and the x86-compatible processors manufactured by Advanced Micro Devices (AMD), Inc., of Sunnyvale, Calif., as well as any other suitable processor.

Hardware system 700 may include a variety of system architectures; and various components of hardware system 700 may be rearranged. For example, cache 726 may be on-chip with processor 702. Alternatively, cache 726 and processor 702 may be packed together as a "processor module," with processor 702 being referred to as the "processor core." Furthermore, certain embodiments of the present invention may not require nor include all of the above components. For example, the peripheral devices shown coupled to standard I/O bus 712 may couple to high performance I/O bus 710. In addition, in some embodiments only a single bus may exist with the components of hardware system 700 being coupled to the single bus. Furthermore, hardware system 700 may include additional components, such as additional processors, storage devices, or memories.

An operating system manages and controls the operation of hardware system 700, including the input and output of data to and from software applications (not shown). The operating system provides an interface between the software applications being executed on the system and the hardware components of the system. According to one embodiment of the present invention, the operating system is the LINUX operating system. However, the present invention may be used with other suitable operating systems, such as the Windows® 95/98/NT/XP/Server operating system, available from Microsoft Corporation of Redmond, Wash., the Apple Macintosh Operating System, available from Apple Computer Int. of Cupertino, Calif., UNIX operating systems, and the like.

The present invention has been explained with reference to specific embodiments. For example, while embodiments of the present invention have been described with reference to specific hardware and software components, those skilled in the art will appreciate that different combinations of hardware and/or software components may also be used, and that particular operations described as being implemented in hardware might also be implemented in software or vice versa. Other embodiments will be evident to those of ordinary skill in the art. It is therefore not intended that the present invention be limited, except as indicated by the appended claims.

The invention claimed is:

1. A method of monitoring a capacitor bank comprising a plurality of capacitor strings connected in parallel, each capacitor string comprising a plurality of capacitors connected in series, the method comprising:
    energizing the capacitor bank;
    determining dissipation factors of each of the plurality of the capacitor strings, wherein determining the dissipation factors comprises:
        monitoring a current waveform of each of the plurality of capacitor strings;
        determining phase angles of the current waveforms;
        calculating the dissipation factors based on the phase angles;
    comparing each of the determined dissipation factors with an expected dissipation factor; and
    estimating a health state of the plurality of the capacitor strings based, at least in part, on the comparison of the determined and expected dissipation factors.

2. The method of claim 1 wherein the expected dissipation factor comprises the dissipation factor of a healthy capacitor string.

3. The method of claim 1 further comprising using a temperature of the capacitor strings in addition to the comparison for estimating the health state.

4. The method of claim 1 wherein the health state comprises one or more of a degradation level, a life expectancy, and a faulty string indication.

5. The method of claim 1 further comprising:
    monitoring high frequency signals of each of the plurality of the capacitor strings;
    determining spectral signatures of the high frequency signals;
    comparing each of the determined spectral signatures with one or more known spectral signatures; and
    estimating the health state of each of the capacitors in each of the plurality of capacitor strings based, at least in part, on the comparison of the determined and the one or more known spectral signatures.

6. The method of claim 5 wherein the health state of the capacitors comprises one or more of a degradation level, a life expectancy, and a failed capacitor indication.

7. A system for monitoring a capacitor bank comprising a plurality of capacitor strings connected in parallel, each of the plurality of capacitor strings comprising a plurality of capacitors connected in series, and a plurality of current transformers, each coupled to one of the plurality of capacitor strings, the system comprising:
    a signal processor coupled to the plurality of current transformers, for monitoring current waveforms of each of the plurality of capacitor strings, determining dissipation factors of the plurality of capacitor strings, based on the current waveforms; comparing each of the determined dissipation factors with an expected dissipation factor; and using the comparison of the determined and expected dissipation factors for estimating a health state of the plurality of capacitor strings.

8. The system of claim 7 wherein the signal processor further comprises a dissipation factor module for determining phase angles of the current waveforms; and calculating the dissipation factors based on the phase angles.

9. The system of claim 7 wherein the expected dissipation factor comprises the dissipation factor of a healthy capacitor string.

10. The system of claim 7 wherein the signal processor is further operable to take into account temperatures of the plurality of capacitor strings in addition to the comparison, for estimating the health state of the plurality of capacitor strings.

11. The system of claim 7 wherein the health state comprises one or more of a degradation level, a life expectancy, and a faulty string indication.

12. The system of claim 7 wherein the signal processor further comprises:
    an RF module for monitoring high frequency signals of each of the plurality of capacitor strings; and
    a spectrum analyzer for determining spectral signatures of the high frequency signals; comparing the determined spectral signatures with one or more known spectral signatures; and using the comparison of the determined and the one or more known spectral signatures for estimating the health state of each of the capacitors in each of the plurality of capacitor strings.

13. The system of claim 12 wherein the health state of the capacitors comprises one or more of a degradation level, a life expectancy, and a failed capacitor indication.

14. A non-transitory computer-readable storage medium with an executable program stored thereon, wherein the program instructs one or more processing units to perform steps of:
    determining dissipation factors of each of the plurality of capacitor strings, wherein determining the dissipation factors comprises:
        monitoring a current waveform of each of the plurality of capacitor strings;
        determining phase angles of the current waveforms;
        calculating the dissipation factors based on the phase angles;
    comparing each of the determined dissipation factors with an expected dissipation factor; and
    estimating a health state of the plurality of the capacitor strings based, at least in part, on the comparison of the determined and expected dissipation factors.

15. The non-transitory computer readable medium of claim 14 wherein the expected dissipation factor is the dissipation factor of a healthy capacitor string.

16. The non-transitory computer-readable storage medium of claim 14 wherein the program instructs one or more processing units to perform the steps of:
  monitoring temperature of the plurality of capacitor strings; and
  using the temperature of the plurality of capacitor strings in addition to the comparison, for estimating the health state of the plurality of capacitor strings.

17. The non-transitory computer-readable storage medium of claim 14 wherein the program instructs one or more processing units to perform the steps of:
  monitoring high frequency signals of each of the plurality of capacitor strings;
  determining spectral signatures of the high frequency signals;
  comparing the determined spectral signatures with one or more known spectral signatures; and
  estimating the health state of each of the capacitors in each of the plurality of capacitor strings based, at least in part, on the comparison of the determined and the one or more known spectral signatures.

18. The non-transitory computer readable medium of claim 17 wherein the health state comprises one or more of a degradation level, a life expectancy, and a failed capacitor indication.

19. A method of monitoring a capacitor bank comprising a plurality of capacitor strings connected in parallel, each capacitor string comprising a plurality of capacitors connected in series, the method comprising:
  energizing the capacitor bank;
  monitoring high frequency signals of each of the plurality of the capacitor strings;
  determining spectral signatures of the high frequency signals;
  comparing each of the determined spectral signatures with one or more known spectral signatures; and
  estimating a health state of each of the capacitors in each of the plurality of capacitor strings based, at least in part, on the comparison of the determined and the one or more known spectral signatures.

* * * * *